United States Patent [19]

Yamane et al.

[11] 4,283,838

[45] Aug. 18, 1981

[54] METHOD OF MAKING PLASTIC ENCAPSULATED SEMICONDUCTOR DEVICES

[75] Inventors: Masahiro Yamane; Toshimi Watanabe; Keiji Itoga; Kiyoshi Ishibashi; Yutaka Morita; Isamu Yamamoto; Kiyoji Imanaka, all of Itami, Japan

[73] Assignee: Mitsubishi Denki Kabushiki Kaisha, Tokyo, Japan

[21] Appl. No.: 11,639

[22] Filed: Feb. 12, 1979

Related U.S. Application Data

[63] Continuation of Ser. No. 780,437, Mar. 23, 1977, abandoned.

[30] Foreign Application Priority Data

Mar. 31, 1976 [JP] Japan ................................. 51-35314
Mar. 31, 1976 [JP] Japan ............................. 51-38987[U]
Apr. 7, 1976 [JP] Japan ............................. 51-43356[U]

[51] Int. Cl.³ ........................................... H01L 21/28
[52] U.S. Cl. ....................................... 29/588; 29/566
[58] Field of Search ............... 29/576 S, 588; 357/70

[56] References Cited

U.S. PATENT DOCUMENTS

| | | | |
|---|---|---|---|
| 3,597,666 | 8/1971 | Taskovich | 357/70 |
| 3,716,764 | 2/1973 | Birchler | 29/576 S |
| 3,735,017 | 5/1973 | Manning | 29/576 S |
| 3,742,599 | 7/1973 | Desmond | 29/588 |

*Primary Examiner*—G. Ozaki
*Attorney, Agent, or Firm*—Oblon, Fisher, Spivak, McClelland & Maier

[57] ABSTRACT

The present invention provides a plastic encapsulated semiconductor device which comprises a connected metal plate having a plurality of semiconductor element holding parts which are connected in series in one direction with at least two connecting arms, said connecting arms having sectional area smaller than that of said semiconductor element holding part and being disposed inside of the side surface of said semiconductor element holding parts in the connecting direction.

The invention provides a method of preparing semiconductor devices having relatively large current capacity of about 5 to 50 amperes used as diodes for automobiles and having high quality in the mass production.

5 Claims, 22 Drawing Figures

METHOD OF MAKING PLASTIC ENCAPSULATED SEMICONDUCTOR DEVICES

This is a continuation, of application Ser. No. 780,437, filed Mar. 23, 1977, now abandoned.

BACKGROUND OF THE INVENTION

1. Field of the Invention

The present invention relates to a plastic encapsulated semiconductor device which is suitable for a semiconductor device having a current capacity of about 5 to 50 amperes.

2. Description of the Prior Art

Figure 1A:
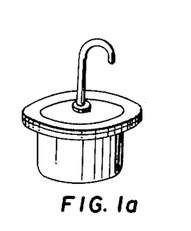
FIG. 1(a) is a schematic view of the conventional can type diode device.

A can type diode has been usually used as a semiconductor having a current capacity of about 5 to 50 amperes as shown in FIG. 1(a).

This has the characteristics that the electric characteristic of the semiconductor device is not deteriorated for a long time because the semiconductor device is sealed in a can. However, it has disadvantages that the parts are expensive and the method of preparing it is complicated resulting in low productivity in mass production and the size and the weight are large.

Heretofore, the connected lead or the connected metal plate so called lead frame have been used for the mass production of I.C., transistors, thyristors or diodes which have a small capacity of less than 5 amperes.

Figure 1B:
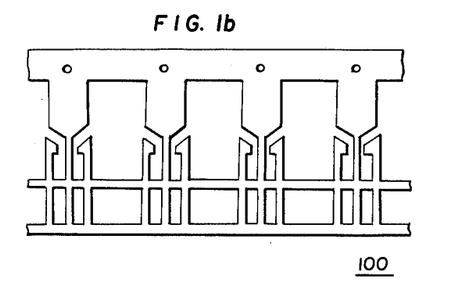
FIG. 1(b) is a plan view of the conventional lead frame used for a mass production of semiconductor devices having small current capacity.

FIG. 1(b) is a plan view of the typical lead frame (100) which has been widely used for preparing transistors or thyristors devices.

The conventional lead frame (100) usually has a thickness of about 0.2 mm to 1 mm and has been prepared by punching a metal plate made of copper or a copper alloy by a press with a metal mold.

However, the lead frame used for semiconductor devices having the current capacity of more than 10 amperes should have the lead frame having more than 2 mm of a thickness of about ten times to that of the conventional lead frame (100) in order to radiate heat generated in a semiconductor element having a pn-junction with high efficiency and to reduce the resistance to the current passed through the lead frame and to give suitable mechanical strength depending upon the size of the semiconductor elements.

When a lead frame is prepared from a metal plate with a metal mold, the side surface contacting the cutting edge of the metal mold is substantially perpendicular to the plane of the lead frame to clearly leave a ridge and the dull of curved ridge is not found, in the case that the lead frame is thin.

However, the dull of curved ridge appears in the case that the lead frame is thick, to form a large curved surface at the ridge between the plane surface and the side surface of the lead frame.

When the semiconductor devices are prepared by using the lead frame having large curved surface at the ridge, various disadvantages are caused.

Referring to FIGS. 2 to 9, the semiconductor device having the conventional thick lead frame having the dull of curved ridge for the plastic encapsulated diode device having relatively large current capacity will be illustrated.

In the description, the lead frame used in the present invention is referred to as a connected metal plate so as to discriminate it from the conventional lead frame.

A thick metal plate (2.5 mm) for mounting a diode element (for 15 amperes) is prepared by punching a master metal plate made of copper or copper alloy with a metal mold.

Figure 2A:
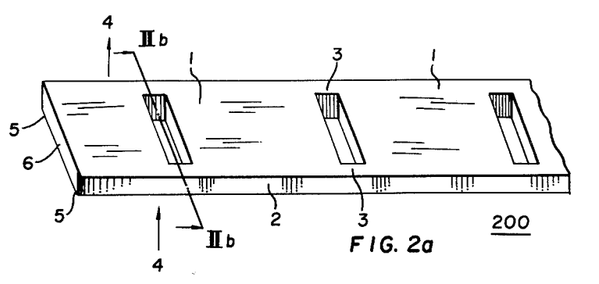
FIG. 2(a) is a schematic view of the conventional connected metal plate used for a mass production of semiconductor devices having relatively large current capacity.
Figure 2B:
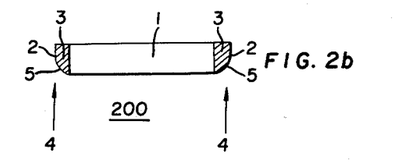
FIG. 2(b) is a sectional view taken along the line $II_b$-$II_b$ of FIG. 2(a)

FIG. 2(a) is a schematic view of a connected metal plate (200) and FIG. 2(b) is a sectional plan view taken along the line II$_b$-II$_b$ of FIG. 2(a).

In FIGS. 2(a), (b), the metal plates (base) (1) are formed on the connected metal plate (200) and are connected in series in one direction with connecting arms (3) having the side surface of the metal plate (1).

In the connected metal plate (200), the large dull (5) is formed in the punching direction because the metal plate is punched by the cutting edge of the metal mold in the arrow line direction (4) in FIG. 2(b).

The condition of the dull (5) at the sectional surface (6) is also shown in the schematic view of FIG. 2(a).

Figure 3:
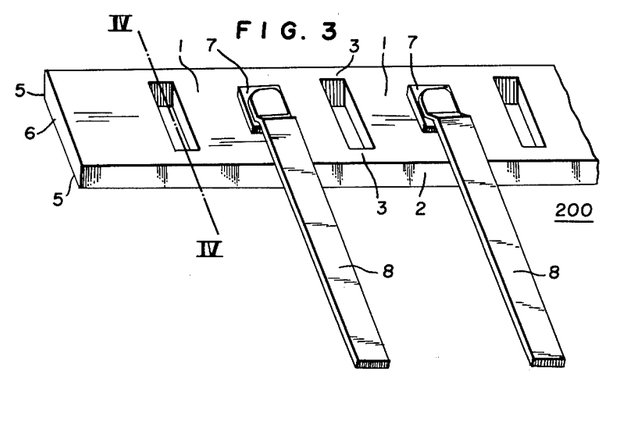
FIG. 3 is a schematic view of the condition that the diode element and the leads are soldered on the connected metal plate of FIG. 2(a)

FIG. 3 is a schematic view showing the condition that the diode element (7) is soldered on the metal plate (1) of the connected metal plate (200) having the dull (5) with a solder, and a lead (8) is soldered on the diode element (7) with a solder.

Figure 4:
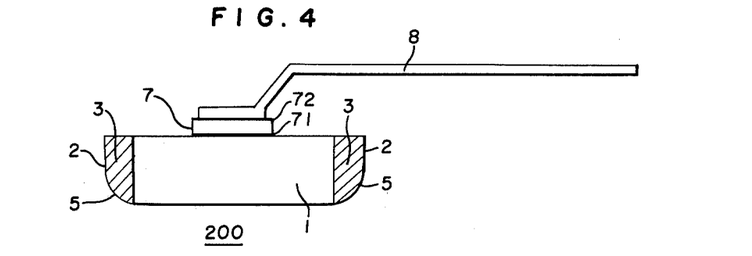
FIG. 4 is a sectional view taken along the line IV-IV of FIG. 3.

FIG. 4 is a sectional plan view taken along the line IV—IV of FIG. 3.

In FIG. 4, the references (71), (72) respectively designate solder layers.

Figure 5:
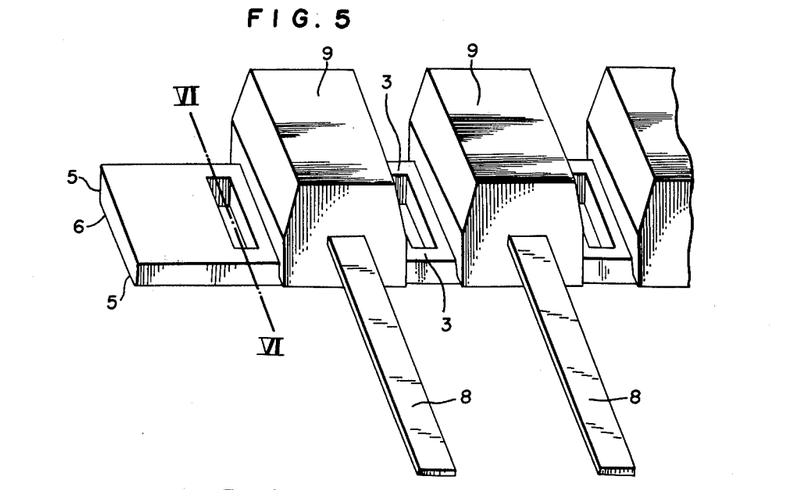
FIG. 5 is a schematic view of the condition of plastic encapsulation of the parts of FIG. 3.

The diode element (7), the part of the metal plate (1) of the connected metal plate (200) and the lead (8) are encapsulated with plastic (9) to form a plurality of the plastic encapsulated diodes on the connected metal plate (200) as shown in the schematic view of FIG. 5.

Figure 6:
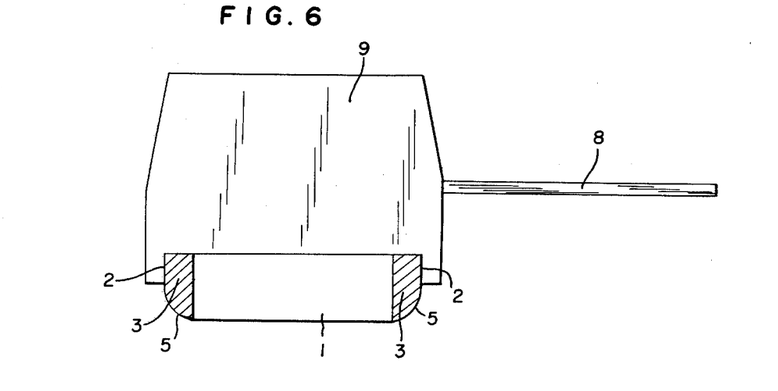
FIG. 6 is a sectional view taken along the line VI-VI of FIG. 5.

FIG. 6 is a sectional front view taken along the lines VI-VI of FIG. 5.

The plurality of the plastic encapsulated diodes on the connected metal plate (200) are cut at the connecting arms (3) to obtain the separated plastic encapsulated diodes.

Figure 7:
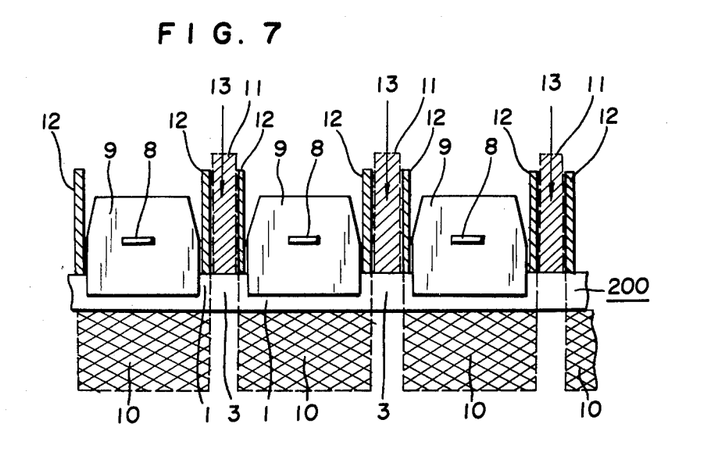
FIG. 7 shows the method of cutting the plastic encapsulated diodes formed on the conventional connected metal plate at the connecting arms.

Referring to the sectional view of FIG. 7, the method of cutting the plastic encapsulated diode devices on the connected metal plate (200) will be illustrated.

As shown in FIG. 7, the connected metal plate (200) is put on a base metal mold (10) so that the surface having the dulls (5) on which the plastic encapsulated part (9) of the connected metal plate (200) is not formed, is contacted with the base metal mold (10).

The push metal mold (12) for deciding the positions of the upper cutting edges (11) is put on the connected metal plate (200) near the plastic encapsulated parts and the upper cutting edges (11) are pushed in the arrow line direction (13) to cut the connecting arms (3) of the connected metal plate (200).

In this condition, the upper cutting edges (11) are adjusted so as to fit between the base metal mold (10) and the base metal mold (10).

The cutting method is usually carried out with high efficiency.

Figure 8:
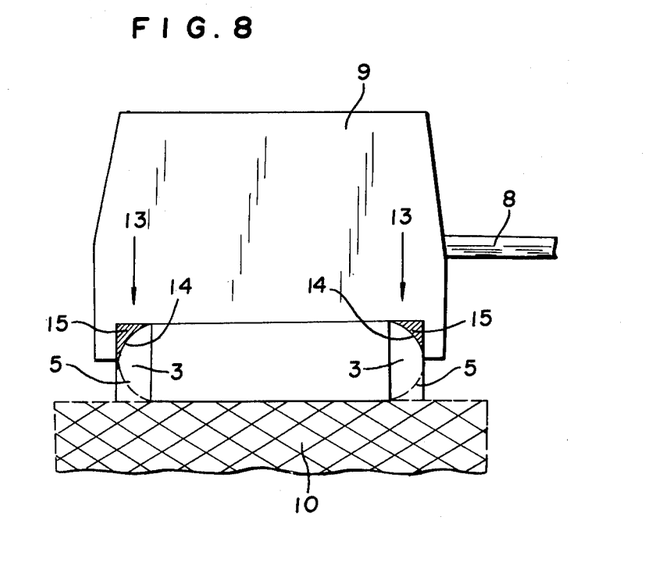
FIG. 8 is a schematic view for illustrating the disadvantage caused by the cutting method shown in FIG. 7.

FIG. 8 shows the condition of the change of the connecting arm (3) cut by the cutting method. That is, FIG. 8 is a front view of the plastic encapsulated diode device formed on the connected metal plate (200) from the cut surface of the connecting arm (3).

Before the cut, the connecting arm (3) have the dulls (5) formed by punching a metal plate by a metal mold to prepare the connected metal plate (200).

The dulls (14) are formed on the connecting arms (3) by the punching force of the upper cutting edges (11) to the connected arms (3) in the arrow line direction under putting the connected metal plate (200) on the plane surface of the base metal mold (10), whereby the voids (15) are formed in the plastic encapsulated part. The formation of the voids (15) causes the deformation of the metal plate (1) whereby the strain is given to the diode element (7) soldered on the metal plate (1) and sometimes the diode element (7) is broken to be deteriorated.

The moisture in the atmosphere is permeated through the void (15) at the boundary surface between the plastic sealed part (9) and the metal plate (1) to cause the disadvantages of the deterioration of the electric characteristics of the diode element (7).

When the semiconductor devices are prepared by using the conventional connected metal plate (200), the above-mentioned serious disadvantages are caused in the semiconductor devices.

SUMMARY OF THE INVENTION

It is an object of the present invention to provide an improved novel connected metal plate.

Another object of the present invention is to provide a novel connected metal plate whose connecting arms can be cut without causing the break of a semicondictor element under stress or the deterioration of the electric characteristics.

Another object of the present invention is to provide a method of preparing a plastic encapsulated semiconductor device suitable for a mass production.

Another object of the present invention is to provide a plastic encapsulated semiconductor device which can be easily prepared and is economical and has excellent electric characteristics.

A further object of the present invention is to provide a plastic encapsulated semiconductor device which is relatively light and small and is easily used for the assembling and the wiring operation.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, wherein like reference numerals designate identical or corresponding parts throughout the several views in which.

DETAILED DESCRIPTION OF PREFERRED EMBODIMENTS

Figure 9A:
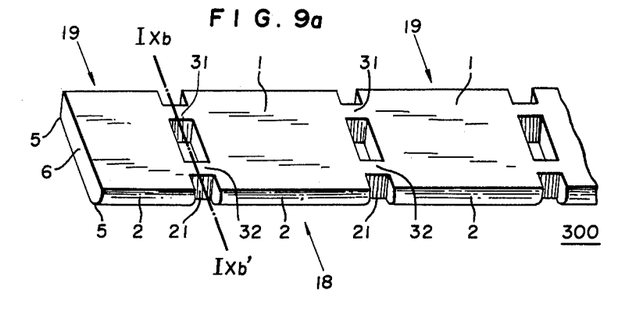
FIG. 9(a) is a schematic view of the connected metal plate according to the present invention.
Figure 9B:
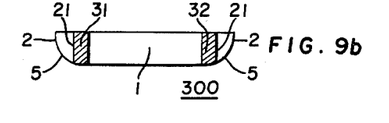
FIG. 9(b) is a sectional view taken along the line $IX_b$-$IX_b$.

FIG. 9(a) is a schematic view of a novel connected metal plate (300) used in the present invention; and FIG. 9(b) is a sectional view of the connected metal plate taken along the line $I_{xb}$-$I_{xb}$ of FIG. 9(a).

FIG. 9(a) shows the semiconductor element holding plate (1) on which a semiconductor element is put and it is preferably a flat metal plate having, for example, a thickness of about 2 mm. The connecting arms (31), (32) have an area smaller than that of the semiconductor element holding plate (1). A plurality of the semiconductor element holding plates (1) are connected in series. The connecting arms (31), (32) are two arms being substantially parallel to each other. The connected metal plate (300) is formed with said parts. The connected metal plate (300) is prepared by punching a master plate made of copper or copper alloy by the metal mold in the conventional method, whereby the large dulls (5) are formed on the side surfaces (2) of the connected metal plate (300).

The two connecting arms (31), (32) for connecting the semiconductor element holding plates (1) should be formed inside of the semiconductor element holding plates (1) at the inner part to the dulls (5).

The outer side surfaces (21) of the two connecting arms (31), (32) are disposed inside of the side surfaces (2) of the holding plates (1) and are arranged to be substantially parallel to the side surfaces (2) of the holding plates (1). This structure is the feature of the connected metal plate (300).

The method of preparing the plastic encapsulated semiconductor devices by using the connected metal plate will be illustrated.

The semiconductor elements used in the invention are prepared as shown in FIG. 10. As shown in FIG.

Figure 10A:
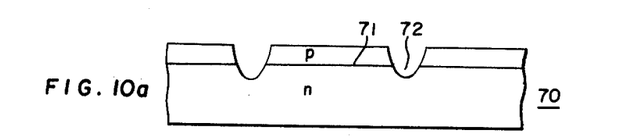
FIG. 10 is a sectional view showing a part of the method of preparing diode elements (pellets) in passivation which are used for the plastic encapsulated semiconductor devices of the present invention.
Figure 10B:
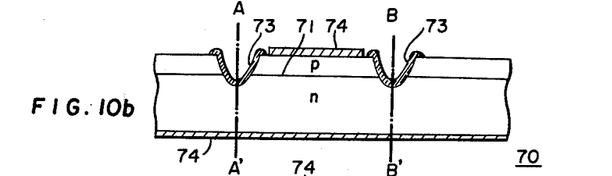
Figure 10C:
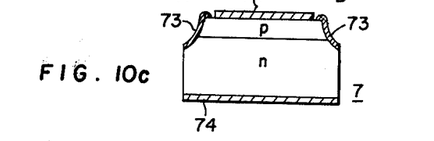

10(a), the groove (72) which reaches from the surface of the p-type layer of the silicon wafer (70) having the pn junction to the pn junction (71) is formed and then as shown in FIG. 10(b), the inorganic glass (73) is coated on the groove (72) and is calcined to protect the pn junction exposed surface. Then the ohmic electrode (74) of laminated metal such as aluminum, nickel or gold is formed on both surfaces of the silicon wafer (70) which is cut from the dotted chain lines A-A' and B-B' to obtain the diode element (7) having glass passivation as shown in FIG. 10(c).

The diode element (7) having glass passivation can be easily handled in air because the pn junction (71) is coated with the inorganic glass (73) and air or metal impurities do not substantially affect the diode element.

Figure 10D:
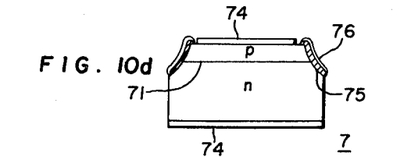

A diode element (7) having nitride passivation wherein a silicon oxide film (75) is formed on the pn junction exposed to the side surface and a silicon nitride film (76) is formed on the silicon oxide film instead of the glass passivation as shown in FIG. 10(d) can be also used for the plastic encapsulated semiconductor device of the invention.

Figure 11:
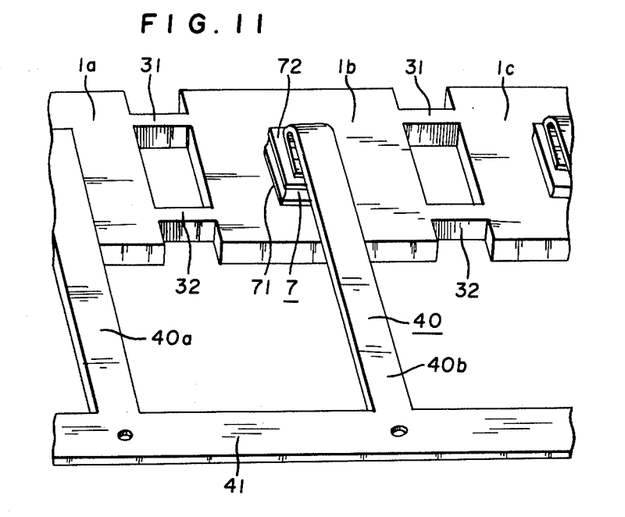
FIG. 11 is a schematic view showing the condition that the diode element of FIG. 10 and the lead frame for electrodes are soldered on the connected metal plate.

One main surface of the diode element (7) having the glass passivation or the nitride passivation is soldered with a Pb-Sn type solder (71) at the center of the semiconductor element holding plate (1) of the connected metal plate (300) as shown in FIG. 11. The other main surface of the diode element (7) is soldered with the Pb-Sn type solder to one end of the ribbon lead electrode (40).

A plurality of the semiconductor element holding plates (1) are connected in series with the connecting arms (31), (32) with each predetermined gap in one direction. The main surface is preferably a flat surface, since it is necessary to decrease the heat resistance in the connection of a heat radiating plate (not shown) for improving the heat radiating effect of the electrode which is one electrode of the resulting plastic encapsulated semiconductor device.

Accordingly, it is preferable to give a predetermined thickness such as about 2 mm for the connected metal plate (300).

The connected arms (31), (32) are cut in the following step whereby it is preferable to have a smaller sectional area of the connected arms which should be smaller than that of the semiconductor element holding plate (1).

The ribbon lead electrodes (40) are formed by a lead frame having a plurality of ribbon metal plates which are connected substantially parallel to each other to the connecting arm (41). The semiconductor element holding plates (1) on which the semiconductor elements (7) are soldered with each gap are substantially parallel to each other. The end of the ribbon lead electrode (40) soldered on the semiconductor element (7) is preferably bent in U-shape or the like because it is sealed with the plastic.

In the invention, when 20 of the semiconductor element holding plates (1) are one group, 20 of the ribbon lead electrodes (40) are used as one group. In order to solder one end of the ribbon lead for electrode (40) to the semiconductor element (7), it is preferable to solder it to be substantially in the perpendicular direction to the connecting direction of the connected metal plate (300) so as to attain the following plastic encapsulation by a transfer molding (by compression transfer molding method).

Figure 12:
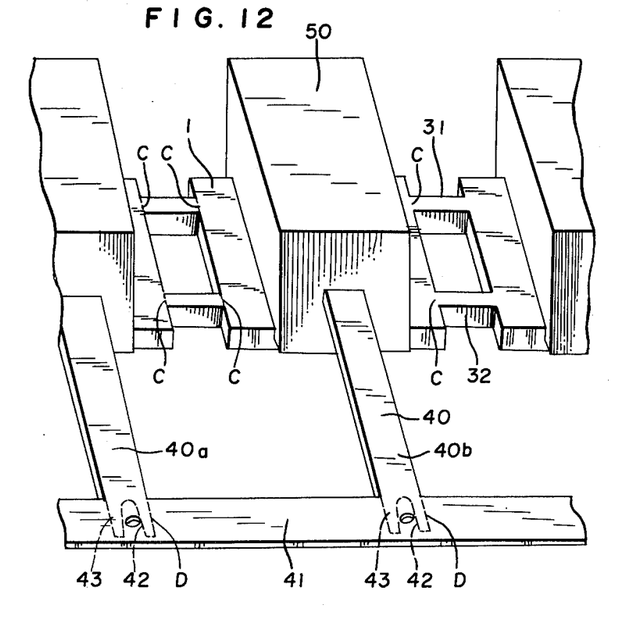
FIG. 12 is a schematic view showing the condition of the plastic encapsulation on the parts.

As shown in FIG. 12, the semiconductor element (7) is encapsulated with a plastic (50) by the transfer molding method except the other main surface of the connected metal plate (300) that is the opposite to the surface soldering the semiconductor element (7) and the connecting arms (31), (32) for connecting the semiconductor element holding plates (1) and the other ends of the ribbon lead electrodes (40).

Since the transfer molding method is employed, 200 to 400 of the semiconductor elements can be encapsulated with the plastic at one operation.

Figure 13:
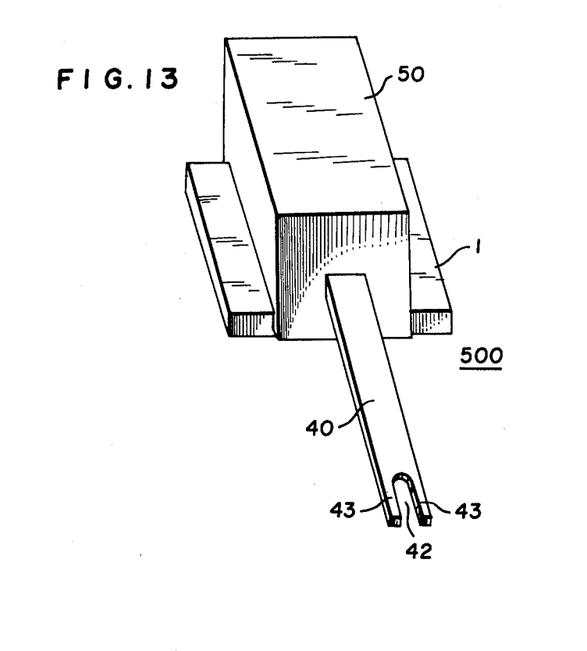
FIG. 13 is a schematic view showing the condition that the separated plastic encapsulated diode device is formed by cutting it along the line C-C of FIG. 12.

Thus, many semiconductor elements are encapsulated with the plastic at one operation and then, the connecting arms (31), (32) for connecting the semiconductor element holding plates (1) are cut from the parts c in FIG. 12, and the connecting parts (41) of the ribbon lead electrodes (40) are cut at the part D (dotted line) to obtain the plastic encapsulated semiconductor devices (500) as shown in FIG. 13, in the method of the invention.

When the connecting arms (31), (32) are cut, it is preferable to cut all of the connecting arms (31), (32) for connecting the semiconductor element holding plates (1) and also all of the connecting parts (41) at the other ends of the ribbon lead electrodes (40) at the same time. It is preferable to cut the other ends of the ribbon lead electrodes (40) to form each notch groove (42) on each end.

The notch groove (42) has two projections at both sides of the groove and the other outer lead (not shown) is inserted into the groove (42), and is firmly clamped. The shape of the top of the ribbon lead electrode (40) can be selected as desired depending upon the usages.

The operation and results of the connected metal plate (300) of the present invention will be illustrated on the embodiment of the plastic encapsulated diode device prepared by using the connected metal plate (300).

Figure 14:
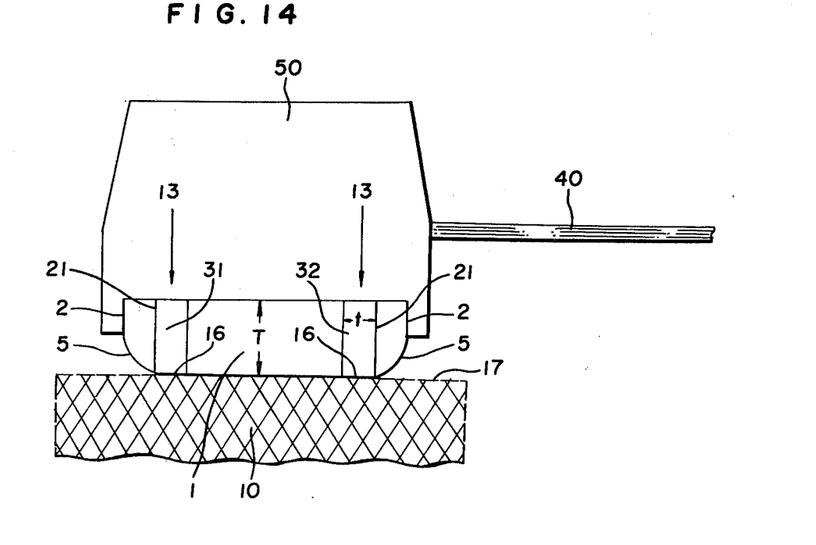
FIG. 14 is a sectional view for illustrating excellent characteristics of the resulting plastic encapsulated diode device.

FIG. 14 is a front view of the plastic encapsulated diode device prepared by using the connected metal plate (300) for semiconductor devices according to the invention.

The method of cutting the connecting arms (31), (32) of the connected metal plate (300) having a plurality of the plastic encapsulated diode devices to separate them is the same with that of FIG. 7.

In FIG. 14, the connecting arms (31), (32) for connecting the semiconductor element holding plates (1) that is the connected metal plate which is put on the base metal mold (10) is cut by moving the upper cutting edges in the arrow line direction (13). In the operation, the connecting arms (31), (32) are formed on the connected metal plate (300) at the position except for the dull (5) of the semiconductor element holding plate (1) whereby the bottom (16) of the connecting arms (31), (32) are contacted to the surface of the base metal mold (17). When the connecting arms (31), (32) are cut by the upper cutting edges, it is possible to prevent the formation of large dulls (14) and the formation of the voids (15) of the semiconductor element holding plates (1) as the case of the conventional connected metal plate (200) shown in FIG. 8. Accordingly, the plastic encapsulated diode device prepared by using the connected metal plate (300) of the invention has no disadvantages of the conventional plastic encapsulated diode device that the inner diode belt is broken when the connecting arms (31), (32) are cut, and the voids are formed between the semiconductor element holding plate (1) and the plastic encapsulated part (9) to cause the deterioration of the electric characteristics by permeating moisture in them.

Thus, two connecting arms (31), (32) are formed between the two semiconductor element holding plates (1), whereby the connected metal plate (300) is not easily bent or deformed as that of the conventional connected metal plate (200) even though parallel stress is applied to the side surface (2) of the connected metal plate (300) in the arrow line directions (18), (19) in FIG. 9(a).

If the connecting arm (31), (32) is one arm and the stress is applied in the arrow line directions (18), (19) in FIG. 9(a), the connected metal plate is easily bent and deformed.

In the invention, the width t of the connecting arms (31), (32) is preferably thinner than the thickness T of the connected metal plate (300) as it is clear from the above therefore mentioned description.

It has been confirmed by experiments in practice that the invention is especially effective for the connected metal plate having more than 2 mm of thickness T.

As shown in FIG. 13, in the plastic encapsulated semiconductor devices obtained by the invention, the ribbon lead electrodes (40) can have a desired shape so as to be easily used for the desired purposes.

Figure 15A:
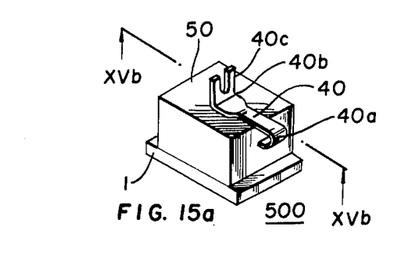
FIG. 15(a) is a schematic view of the other embodiment of a ribbon lead electrode.
Figure 15B:
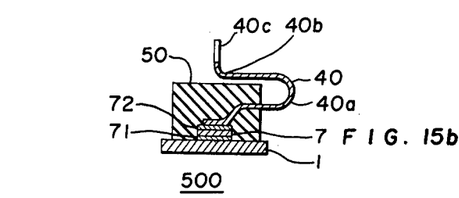
FIG. 15(b) is a sectional view taken along the line $XV_b$-$XV_b$ of FIG. 15(a)

FIGS. 15(a) (b) show certain examples that the connecting parts for wiring of the lead electrodes (40) are disposed at the top of the plastic encapsulated semiconductor device (500) so as to easily carry out the assembly or the wiring by an automatic machine.

FIG. 15(a) is a schematic view of the plastic encaplulated semiconductor device and FIG. 15(b) is a sectional view taken along the line XV-XV.

As it is clear from FIG. 15, the part projected from the semiconductor element connecting part out of the plastic is bent at the first bending part (40a) in the U-shape and is bent at the second bending part (40b) to the L-shape whereby the connecting part for wiring which has the notch groove (42) is disposed at the top of the semiconductor element and it is extended perpendicular to the semiconductor element.

Figure 16:
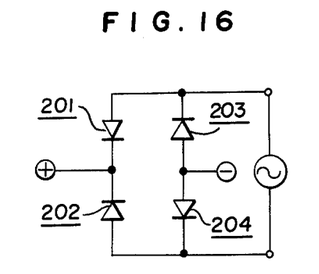
FIG. 16 is a circuit diagram of a full wave rectification circuit.
Figure 17:
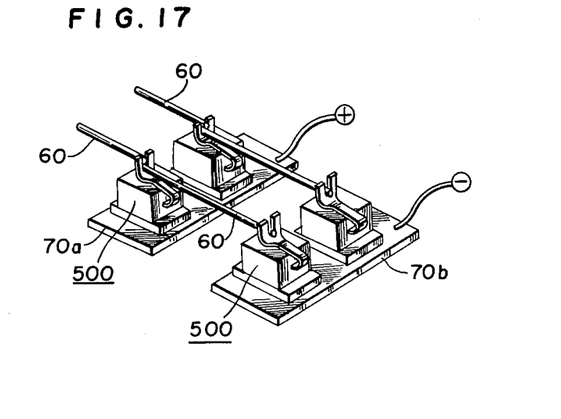
FIG. 17 is a schematic view showing the wiring condition of the full wave rectification circuit.

When the diode element (pellet) is assembled in a full wave rectification circuit as shown in FIG. 16, the structure of FIG. 17 can be considered and the wiring operation can be remarkably simple.

Figure 18:
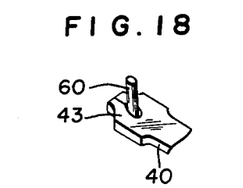
FIG. 18 is a schematic view showing the condition clamping the ribbon lead electrode on the wiring parts.

A constant linear wiring line (60) can be used and the clamping operation can be easily carried out from the upper position as shown in FIG. 18. The area for assembling the semiconductor device can be small. The stress applied to the connecting part for wiring in the wiring operation can be received at the upper surface of the plastic (50) whereby the deformation of the lead electrode (40) can be prevented and breakage of the semiconductor device can be prevented.

As described above, the plastic encapsulated semiconductor devices prepared by the method of the invention have remarkable advantages as follows in comparison with the conventional can type semiconductor devices having large current capacity such as about 50 amperes.

(1) The exposed surface of the pn junction of the semiconductor element is coated with a protective film of the inorganic glass or the nitride whereby the plastic encapsulated semiconductor devices whose electric characteristics are not changed for a long time can be continuously produced in a mass production.

(2) The other main surface of the semiconductor element holding plate (30) is not coated with a plastic whereby a heat radiating means is contacted to the surface to increase the heat capacity to obtain the plastic encapsulated devices having large current capacity such as about 50 amperes.

Accordingly, the plastic encapsulated semiconductor devices having the characteristics which are the same as those of the can type semiconductor device, can be produced by the simple operation in a continuous mass production.

(3) The parts of the semiconductor device comprise 5 pieces of two solder foils, one semiconductor element holding plate, one ribbon lead electrode and the resin. The number of the parts is less than that of the parts of the can type semiconductor device (except semiconductor element).

(4) The prices of the parts are remarkably lower than those of the can type semiconductor device.

As described above, the plastic encapsulated diode device of the present invention has remarkably advantageous characteristics and has economical efficiency and is a suitable plastic encapsulated semiconductor rectifier.

In the description, the diode elements are used as the semiconductor element. Thus, the thyristor elements or the transistor elements can be also used in the method of the invention.

What is claimed is:

1. A method of preparing plastic encapsulated semiconductor devices which comprises the steps of:
   preparing a connected metal plate in which a plurality of semiconductor element holding parts are connected in series in one direction with at least two connecting arms, disposed between each pair of semiconductor holding parts, said connecting arms each having an area smaller than that of said semiconductor element holding parts;
   forming all of said connecting arms inside the side surfaces of said semiconductor element holding parts in the connecting direction for substantially preventing the formation of dulls caused by punching a metal plate;
   providing semiconductor elements having a pair of main surfaces in parallel with each other and a pn junction in said semiconductor elements, the exposed pn junction being coated with one of a glass passivation and a nitride passivation;
   bonding the semiconductor elements on one main surface of said semiconductor element holding parts;
   providing a lead frame having a plurality of spaced parallel ribbon lead electrodes extending from a common connecting part;
   bonding the free ends of the ribbon lead electrodes on the other of the main surfaces of said semiconductor elements;
   plastic encapsulating said semiconductor elements, said semiconductor element holding parts and said ribbon lead electrodes except said connecting arms, the other main surface of said semiconductor element holding parts and the connecting part of said ribbon lead electrodes;
   separating said semiconductor devices by cutting said connecting arms of said connected metal plate and the connecting part of said ribbon lead electrodes; and
   supporting the connecting arms along the entire width of the connecting arms against the action of cutting of the connecting arms so as to prevent deformation of the semiconductor element holding parts.

2. A method of preparing plastic encapsulated semiconductor devices according to claim 1 wherein said bonding step includes:
bonding free ends of ribbon lead electrode which are projected substantially perpendicular to the connecting direction of said connected metal plate on the other of the main surfaces of said semiconductor elements.

3. A method of preparing plastic encapsulated semiconductor devices according to claim 2 wherein the bonding step includes:
bending free ends of said ribbon lead electrodes to U-shape and soldering the edge arm on the other of the main surfaces of said semiconductor element.

4. A method of preparing plastic encapsulated semiconductor devices according to claim 1 including the step of:
bending the exposed cut part of said ribbon lead electrodes at an upper part in a U-shape and in an L-shape above said semiconductor element.

5. A method of preparing plastic encapsulated semiconductor devices according to claim 1 wherein the step of plastic encapsulating includes:
plastic encapsulating by a transfer mold method said semiconductor elements, said semiconductor element holding parts and said ribbon lead electrodes except said connecting arms and the other main surface of said semiconductor holding parts and connecting parts of said ribbon lead electrodes.

* * * * *